US007609179B2

United States Patent
Diaz-Gutierrez et al.

(10) Patent No.: US 7,609,179 B2
(45) Date of Patent: Oct. 27, 2009

(54) METHOD FOR COMPRESSED DATA WITH REDUCED DICTIONARY SIZES BY CODING VALUE PREFIXES

(75) Inventors: Pablo Diaz-Gutierrez, Granada (ES); Vijayshankar Raman, Sunnyvale, CA (US); Garret Swart, Palo Alto, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/970,844

(22) Filed: Jan. 8, 2008

(65) Prior Publication Data
US 2009/0174583 A1 Jul. 9, 2009

(51) Int. Cl.
*H03M 7/38* (2006.01)
(52) U.S. Cl. ............................ 341/51; 341/50
(58) Field of Classification Search .................. 341/50, 341/106, 65, 67, 78, 79
See application file for complete search history.

(56) References Cited

U.S. PATENT DOCUMENTS

| | | | | |
|---|---|---|---|---|
| 5,363,098 | A * | 11/1994 | Antoshenkov | 341/95 |
| 6,518,895 | B1 | 2/2003 | Weiss et al. | |
| 6,529,912 | B2 * | 3/2003 | Satoh et al. | 707/101 |
| 7,088,271 | B2 * | 8/2006 | Marpe et al. | 341/107 |

* cited by examiner

*Primary Examiner*—Peguy JeanPierre
(74) *Attorney, Agent, or Firm*—IP Authority, LLC; Ramraj Soundararajan (57) ABSTRACT

The speed of dictionary based decompression is limited by the cost of accessing random values in the dictionary. If the size of the dictionary can be limited so it fits into cache, decompression is made to be CPU bound rather than memory bound. To achieve this, a value prefix coding scheme is presented, wherein value prefixes are stored in the dictionary to get good compression from small dictionaries. Also presented is an algorithm that determines the optimal entries for a value prefix dictionary. Once the dictionary fits in cache, decompression speed is often limited by the cost of mispredicted branches during Huffman code processing. A novel way is presented to quantize Huffman code lengths to allow code processing to be performed with few instructions, no branches, and very little extra memory. Also presented is an algorithm for code length quantization that produces the optimal assignment of Huffman codes and show that the adverse effect of quantization on the compression ratio is quite small.

15 Claims, 8 Drawing Sheets

METHOD FOR COMPRESSED DATA WITH REDUCED DICTIONARY SIZES BY CODING VALUE PREFIXES

BACKGROUND OF THE INVENTION

1. Field of Invention

The present invention relates generally to the field of encoding. More specifically, the present invention is related to a method for compressing data with reduced dictionary sizes by coding value prefixes.

2. Discussion of Related Art

With the success of multi-core CPUs and data parallelism in GPUs, modern processors are once again gaining processing capability at the same rate that they are gaining transistors. However, access to memory has not been improving as quickly. This has led to a resurgence of interest in compression, not only because it saves disk space and network bandwidth, but because it makes good use of limited size memories and allows data to be transferred more efficiently through the data pathways of the processor and I/O system. The focus on using compression for increasing speed rather than capacity means that there is a new focus on the speed at which data can be decompressed. The speed of decompression is generally of more interest that the speed of compression because many data items are read mostly, that is they are compressed and written once, but read and decompressed many times.

A standard compression technique is dictionary coding. The idea is to place some frequent values in a dictionary, and assign them codewords, which are shorter (i.e., take fewer bits to represent) than the corresponding values. Then, occurrences of these values in a data set can be replaced by the codewords. This technique has been well studied and is widely used in different forms: a common example is Huffman Coding.

The drawback with this standard dictionary coding is that dictionaries can get very large when the domain has many distinct values. For example, if a column in a database of retail transactions contains dates, then some dates might be much more common than others (say weekends, or days before major holidays), so dictionary coding might be considered. But the number of distinct dates can run in tens of thousands.

However, dictionary based compression—the most common and effective form of compression—has a problem when running on modern processors: Compression replaces values on the sequentially accessed input stream with shorter codes that have to be looked up in a dictionary. This converts cheap sequential accesses from the input stream into what is arguably the most expensive instruction on a modern processor: a random read from main memory to access the value in the dictionary.

Random reads are expensive because they generally miss in the cache, access only a small portion of the cache line, and are not amenable to pre-fetching [see paper to Baer et al. "An effective on-chip preloading scheme to reduce data access penalty"]. One load instruction can cause the processor to stall for hundreds of cycles waiting for the result to arrive from memory, which, has been getting slower as CPUs have gotten faster. With simultaneous multi-threading (SMT) the processor can overlap its resources by running a second hardware thread while the first thread waits for the load to complete. This works fine if the miss rate on the threads is low, but if the thread miss rate is too high then all the threads can end up stalling for memory and the processor is forced to wait.

Random reads from the dictionary can be so expensive that it can become the bottleneck on performance. To remedy this, the size of the dictionary is limited so it can fit in the on-chip memory of the processor. The straightforward approach to limiting the size of the dictionary is to place only a subset of the values in the dictionary and to place any values missing from the dictionary directly in the input, in lined. While this simple approach improves the memory behavior, it decreases the compression ratio, making the compression far less effective and decreasing the data transfer speed. This is especially true when the on-chip memory is small.

Once the dictionary fits in the on-chip memory of the processor, the next bottleneck in processing compressed data is caused by mispredicted branches during decompression. This occurs because traditional Huffman code processing executes one or more unpredictable branches for each code it processes. A branch is unpredictable if it is taken or not taken with similar probability. Each mispredicted branch can take the processor dozens of cycles to recover (see, for example, the paper to Sprangle et al. entitled, "Increasing processor performance by implementing deeper pipelines").

The entropy coding of data was one of the founding topics in Information theory, and Huffman's seminal work (in the paper entitled, "A method for the construction of minimum redundancy codes") on entropy coding broke the ground for all that followed. Huffman codes separately encode each value as a bit string that can be compared and manipulated independently from the rest of the data.

Most work on fixed size dictionaries has been done in the context of online adaptive dictionary maintenance as embodied in LZ compression (see, for example, the paper to Lempel et al. entitled, "On the complexity of finite sequences"), where the dictionary is constantly changing in response to the data that has been compressed so far. In LZ compression and most of its variants, the dictionary is built over a window, a fixed size sequence of previously scanned characters that are searched during compression for repeating strings and retained during decompression to be used by the dictionary. A primary topic of interest in this field is online item replacement algorithms, which determines when to replace an existing dictionary entry with a new entry or when to change the Huffman code associated with an entry. This problem has been shown to be difficult (for example, see paper to Agostino et al. entitled, "Bounded size dictionary compression: Sck—completeness and nc algorithms").

Length-limited coding is a generalization of fixed size dictionaries in which codes may have lengths between 1 and some integer L. One of the longest lasting contributions in the area is the paper to Larmore et al. entitled, "A fast algorithm for optimal length-limited Huffman Codes," which introduces an O(nL) algorithm for computing optimal compression codes of bounded length L. In a more system-specific approach described in the paper to Liddell et al. entitled, "Length-restricted coding using modified probability distributions," optimally restricts the length of compression codes to a size that fits in a word of the underlying architecture. Like the papers to Milidiu et al. (entitled, "Efficient implementation of the WARM-UP algorithm for the construction of length-restricted prefix codes" and "In-place length-restricted prefix coding"), they also provide heuristics that run significantly faster than the algorithm, as described in the paper to Larmore et al. entitled, "A fast algorithm for optimal length-limited Huffman Codes," while suffering little loss in compression performance. An additional improvement to the fundamental algorithm is introduced by Turpin et al. in the paper entitled, "Practical Length-Limited Coding for large Alphabets," which also teaches producing optimal results in the same running time using only O(n)space.

Online adaptive dictionary maintenance, albeit quite popular in some domains, is too expensive for many applications and has little gain in coding ability. Worst of all, it also interferes with parallelization as the adaptations have to be taken into account before the next item can be decoded.

In order to be able to manage very large datasets practically, it is often necessary to sample the input to produce a representative summary of its content. Moreover, it is crucial being able to do this efficiently in one pass, given the sometimes humongous size of current databases. Historically, two alternative sampling methods meet these requirements: reservoir (see paper to Vitter et al. entitled, "Random sampling with a reservoir") and Bernoulli (see paper to Olken et al. entitled, "Simple random sampling from relational databases") sampling, based on replacement and accept/reject policies, respectively. Recently, the paper to Germulla et al. entitled, "A dip in the reservoir: maintaining sample synopses of evolving datasets," introduced a modification of reservoir-sampling to consistently manage online deletion of samples during sampling. In order to make an informed decision regarding the appropriate size of a dictionary, an estimation of the dataset cardinality is necessary. To compute a statistically reliable cardinality estimation, the paper to Markl et al. entitled, "Maxent: consistent cardinality estimation in action," looks at the distribution of the uniform hash values of an input sampling and extrapolates the measured hash value density to the whole range of values of the hash function. Related to the specific problem of compressed databases, the paper to Srivatsava et al. entitled, "Consistent histogram construction using query feedback," uses query feedback information to elaborate a dataset histogram based on the principle of maximum entropy, keeping its size always bounded.

Recently, Raman et al. (in the paper entitled, "How to wring a table dry: entropy compression of relations and querying of compressed relations") use a delta coding of consecutive values in a column-oriented database in order to minimize the computations required for decompression, even allowing some operations to be performed on the uncompressed codes.

In U.S. Pat. No. 6,518,895, compressed symbols are parsed to determine in which class they belong, in order to choose from a set of class-specific look-up tables, thus reducing the required number of branch instructions. The PNG image compression format (see for example, the article by Hammel entitled, "Png: The definitive guide") groups codes with similar length categories that will be accessed via a length identification code. Then a small number of bits determine the actual code length, allowing an efficient decoding.

Whatever the precise merits, features, and advantages of the prior art methods, none of them achieves or fulfills the purposes of the present invention.

SUMMARY OF THE INVENTION

The present invention provides a value prefix coding (VPC) scheme for the loss less encoding of values using a fixed sized dictionary that can be kept in on-chip memory. Instead of holding complete values, a value prefix dictionary may hold prefixes of the values. This makes each dictionary entry potentially more useful in that it can be used for representing more than one value. The input to the compression method consists of raw values. The compressed output stream contains dictionary codes (representing value prefixes) and value suffixes. During decompression, values are constructed by reading a prefix from the dictionary and possibly appending a value suffix from the compressed stream. We show on a variety of inputs how much better value prefix dictionaries make use of the same sized dictionary than the straightforward dictionary subset approach, in terms of compression ratio.

The present invention also provides for an algorithm for computing the optimal prefix dictionary contents, wherein the algorithm achieves compression ratios much better than that of the subset approach, while adding only a few extra instructions to the decode, for concatenating the prefix from the dictionary and the suffix from the input stream.

The present invention also teaches a novel way of quantizing Huffman code lengths to allow code processing to be performed with no branches, few instructions, and very little extra memory. The present invention also provides an algorithm for producing the optimal quantized Huffman dictionary and show that the adverse effect of quantization on the compression ratio is very small.

The present invention also teaches both value prefix coding and code length quantization, exploring the formats, the compression achieved by the format on real data, and algorithms for generating optimal dictionaries that support the format. While these two techniques are discussed separately, they are designed to be used together (i.e., value prefix coding to determine the set of values to be stored in the dictionary and code length quantization to assign easy to process entropy codes to those values).

The present invention also provides a computer-based method to compress a set of data values from one or more domains, wherein the computer-based method is implemented in computer readable program code stored in computer memory, and wherein the computer-based method comprises the steps of: (a) building a dictionary and assigning prefix codes to a subset of the set of data values, and (b) coding each value in said set of data values as a combination of a codeword for its longest prefix that falls within the subset, followed by a suffix associated with each value.

The present invention also provides for a computer-based method to compress a dataset of values from one or more domains, wherein the computer-based method is implemented in computer readable program code stored in computer memory, and wherein the computer-based method comprises the steps of: (a) receiving input data; (b) identifying a dictionary size budget; (c) scanning a sample of input data values to identify occurrence frequencies of each value prefix in the sample; (d) based on the identified dictionary size budget in (b) and the identified occurrence frequencies in (c), choosing a subset of value prefixes for which codewords are to be assigned; (e) building a dictionary and assigning prefix codes to the chosen subset of value prefixes in (d); and (f) rescanning the input data wherein, for each given value v, finding its longest prefix u, chosen in step (e) and outputting a concatenation of codeword(u) and w, wherein w is the suffix of value v, said suffix comprising remaining uncoded bits of said given value.

The present invention also provides an article of manufacture comprising computer usable medium implementing a computer-based method to compress a dataset of values from one or more domains, wherein the computer-based method implemented in computer readable program code stored in computer memory, and wherein the medium comprises: (a) computer readable program code aiding in receiving input data; (b) computer readable program code aiding in identifying a dictionary size budget; (c) computer readable program code aiding in scanning a sample of input data values to identify occurrence frequencies of each value prefix in the sample; (d) based on the identified dictionary size budget in (b) and the identified occurrence frequencies in (c), computer readable program code aiding in choosing a subset of value prefixes for which codewords are to be assigned; (e) computer readable program code aiding in building a dictionary and assigning prefix codes to the chosen subset of value prefixes in (d); and (f) computer readable program code aiding in rescanning the input data wherein, for each given value v, finding its longest prefix u, chosen in step (e) and outputting a concatenation of codeword(u) and w, wherein w is the suffix of value v, said suffix comprising remaining uncoded bits of said given value.

DESCRIPTION OF THE PREFERRED EMBODIMENTS

While this invention is illustrated and described in a preferred embodiment, the device may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

The present invention's method reduces the dictionary size by considering, for coding, not just the actual values in the data set, but also the prefixes of these values. The idea is that in many domains, frequency distributions are "bumpy"— values in a range tend to have similar frequencies, and these values will share a long prefix. So if these prefixes can be coded, then the rest of the value (the suffixes) can be stored in-line in the data itself.

Figure 1:
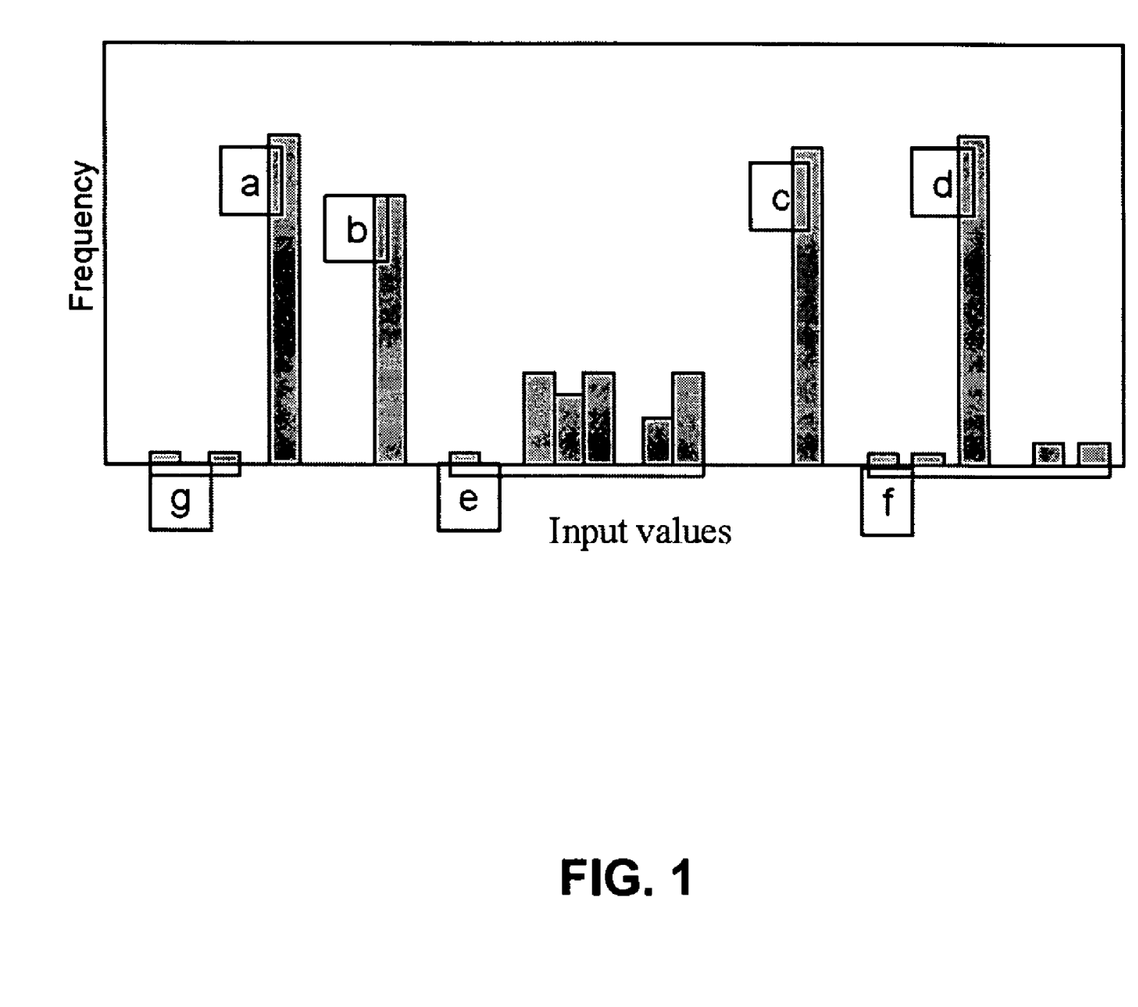
FIG. 1 illustrates an input histogram depicting input values and the frequency associated with such input values.

For example, in the frequency distribution shown in FIG. 1, values are arranged in lexicographic order. FIG. 1 illustrates an input histogram depicting input values and the frequency associated with such input values. It should be noted that the value frequencies are clustered—there are 4 common values, and 3 value ranges. For a dictionary size of 16 or more entries, a separate codeword is assigned to each value. But for a smaller dictionary of 7 entries, separate codes (a, b, c, d) are assigned to the 4 common values, and 3 codes (bars e, f, g) to the 3 clusters. Then, a clustering method is used to represent a value within a cluster by the codeword for its cluster, followed by an identifier within the cluster. Clusters are chosen to be aligned with value prefixes, so the identifier is just the value suffix. For example, if cluster "e" has prefix 0x101 and a value in this cluster is 0x101110, the value is coded as e.110. An alternative is to use as identifier a "uniform code" that just represents the value index within the cluster (in log(cluster size) bits).

This approach reduces dictionary sizes because all values in a cluster together take up only one dictionary entry. For a given budget of dictionary size, a set of prefixes are carefully chosen that will fit within the budget, while permitting maximum compression. Several methods are presented for doing this optimization, including simple greedy heuristics and a dynamic programming solution that is guaranteed to find the optimal set of prefixes. This method is implemented in CSVZIP, a utility for extreme compression and querying of tabular data. Greedy heuristic is used to achieve almost the same compression ratio as the dynamic programming method, while running much faster.

The user can set the dictionary size according to the machine parameters and required processing speed—e.g., L1 or L2 cache size.

The present invention's method also applies to the simultaneous optimization of multiple dictionaries. For example, in database compression, there can be values from multiple domains in the same dataset (e.g., values from different columns in a relational database, or values with different annotations in a text document database). For a given overall dictionary budget, the best subset of value prefixes is chosen from each column to assign codewords.

In one embodiment, the present invention's method comprises the steps of:

scanning the input data and count the occurrence frequencies of each value prefix. To keep memory consumption small, this is done over a sample of the values;

based on the frequencies and the dictionary size budget, choosing a subset of the value prefixes to assign codewords;

assigning codewords to these chosen value prefixes by building a Huffman tree, and rescanning the input data; for each value v, the longest prefix u that was chosen in the step above is found (e.g., if the suffix of v is w (i.e., v=u.w), then, "codeword(u). w" is output).

In order to make the prefix sharing between input values more apparent, a prefix tree, or trie, is constructed representing the statistical information about the input data. In this trie, a leaf represents a complete input value, while an intermediate node represents the common prefix for the set of input values which are represented in the branch of the trie under that node. This information is stored in the form of node labels. With this representation, choosing prefixes of values (step 2) becomes choosing nodes of the trie.

A brute force approach to this optimization problem would be extremely expensive, since the number of possibilities to be tested with N distinct input values and a dictionary budget of K entries is O[N!/(K!(N−K)!)]. Fortunately, since the solution to the optimization on one branch of the trie is independent of the (complementary) solution on its sibling, redundant computations need not be performed more than once. This is the basis for the present invention's dynamic programming algorithm to compute the optimal solution to this problem.

Choosing Prefixes by Dynamic Programming

A node whose represented prefix is selected to become a dictionary entry (i.e., assigned a codeword), is called a chosen node. The neck of a node is the length of the ascending sequence of ancestors until its first chosen ancestor or the root, whichever is shorter. The neck of a node 'v' is represented as neck(v). The left and right children of node 'v' are denoted as left(v) and right(v), respectively. Let freq(v) be the occurrence frequency of a node v (i.e., the fraction of values in the input that have this prefix).

The benefit of node v is the average amount of compression per value gained by choosing node v:

benefit(v)=freq(v)×neck(v)−freq(v)log(1/freq(v))

wherein the first term is the savings (we avoid repeating this prefix for each value), and the second term is the cost (the codeword is used instead, and this will cost about log(1/freq(v)) for schemes like Huffman coding).

It should be noted that neck(v) is determined by which ancestors of v are chosen. So, all K nodes are simultaneously chosen to get the optimal solution. For a sub-tree of the trie rooted at node 'v', let bestPrefixes(v, K, L) be the best set of prefixes (or trie nodes) to chose, for a given dictionary budget K and a neck length L. Let benefit(v,K,L) be the corresponding benefit (sum of benefits of all the chosen nodes).

If 'v' is not a leaf node, then

```
benefit(v,K,L) = max {
max    { benefit(left(v), i, L+1) + benefit(right(v), K−i, L+1) | 0<=i<=K }
max    { benefit(left(v), i−1, 1) + benefit(right(v), K−i, 1)    | 1<=i<=K }
       }
``` and correspondingly,

```
bestPrefixes(v,K,L) is argmax {
argmax   {bestPrefixes(left(v), i, L+1) U bestPrefixes(right(v), K−i, L+1) |
         0<=i<=K},
argmax   {bestPrefixes(left(v), i−1, 1)   U bestPrefixes(right(v), K−i, 1) |
         1<=i<=K }
         }
```

In the first case, the budget is simply shared among the two children of 'v', while in the second case 'v' itself is chosen, and only the remaining budget is saved for its offspring. On the other hand, if node 'v' is a leaf, then determining whether it will be chosen is just a matter of seeing if the dictionary budget allows it:

benefit(v, K, L) = 0 if K = 1,

= benefit(v) if K >= 1

The number of possibilities to be evaluated is roughly 2K at each node, for each neck length. If computed results are stored in a memorization table for look up, the number of entries (and therefore the time complexity of the algorithm) is O(KN log(N)), because the size of the tree is 2N−1, and the average length of the paths from root to leaves is log(N).

Choosing Prefixes by Greedy Heuristics

While it is valuable to be able to compute the optimal choice of prefixes, more often it is sufficient to have a cheap, reasonably good approximation. Several heuristics are designed to achieve this goal, all requiring considerably less computing time than the optimal solution, while using the same trie representation for the prefixes.

One of the best heuristic that was found is:
Set chosenNodes={root};
for i=1 to K do
  compute the benefit of each of the trie nodes not in chosenNodes, taking each node's neck to be its distance to its closest ancestor in chosenNodes
  Let x be the node with the highest benefit
  chosenNodes=chosenNodes U x While this algorithm takes much less time to finish than the dynamic programming approach above, the compression ratio exhibited by the resulting dictionary in our experiments is very similar, or even identical for some values of the budget (see attached graph). Therefore, it is reasonable to use this greedy approach on a regular basis, resorting to the previous algorithm only when optimality is required.

Other optimization heuristics are also presented that might work well under specific circumstances. A brief summary of some of them follows:

Top-down split algorithm: Start by choosing the root of the trie. At each step, determine the benefit increase produced by splitting each chosen node. Splitting a node means to choose its two children instead of itself. Pick the node with the highest benefit, split it and repeat until the dictionary budget has been exhausted.

Bottom-up collapse algorithm: Conceptually symmetric to previous method. Collapsing a pair of chosen sibling nodes means to choose their parent instead of themselves. In this algorithm, one starts by choosing all the leaves, and iterate collapsing pairs of siblings until we meet the dictionary budget requirements. At each step, we collapse the pair of siblings that would produce the least decrease in the overall benefit.

Best-K algorithm: Simply compute the initial benefit of every node in the trie, and choose the K with highest benefit, where K is the size of the dictionary.

Dichotomic Huffman: Similar to the Best-K method, but restricting the choice of nodes to only the leaves.

The present invention's method is implemented in CSVZIP, a utility to compress tabular data and scan over it. Attached is a plot of the estimated resulting size of a tabular data file (taken from a baseball dataset with real data) when compressed using each of the methods described above (x-axis is budget of dictionary entries, and y-axis is compressed size in bits). The dynamic programming (optimal) method is labeled as naive-optimal, and the greedy approach recommended before is called greedy-brute force. Notice that both methods converge quickly to a very small compressed size, even with a budget of about 200 entries. In contrast, the number of distinct values is 1366 (across all columns; the dataset has 8 columns)

Value Prefix Coding

Compression methods based on variable length codes exploit the skew frequently found in data sets. Frequent values are assigned short codes, and vice versa. The main idea behind value prefix coding is that often popular data values cluster together. Based on that, a single dictionary code is assigned that can be used to code many values within a cluster. By doing so, effective compression is achieved with a very small dictionary.

Figure 2A:
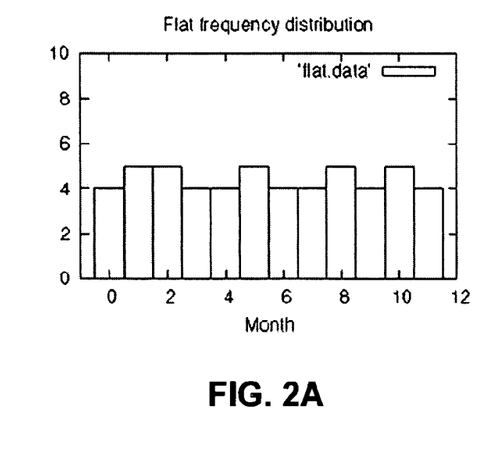
FIG. 2A, FIG. 2B and FIG. 2C illustrate three types of data distributions—flat frequency distribution, spikey frequency distribution, and bumpy frequency distribution.
Figure 2B:
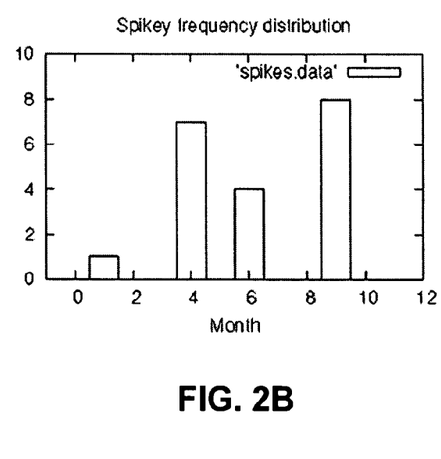
Figure 2C:
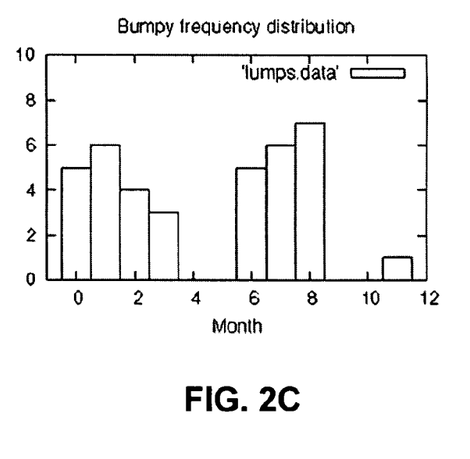

FIG. 2A, FIG. 2B and FIG. 2C illustrate three types of data distributions—flat frequency distribution, spikey frequency distribution, and bumpy frequency distribution. In FIG. 2A, a dataset is shown with a flat frequency distribution. In FIG. 2B, a dataset is shown with spikes that show no spatial correlation. In FIG. 2C, a dataset is shown with lumps of frequent values between runs of rare values. In practice, combinations of all these types are common. Different compression methods (range offset coding, dictionary-based or a hybrid) work better with different frequency distributions.

The histograms in FIGS. 2A-C represent millions of unique visitors to three hypothetical web sites. Because its data distribution is perfectly uniform, if one were to represent the months from dates pulled from the web logs of the first site, the best one can do is to avoid the use of a dictionary entirely and just code the month values inline as values in a range from 1 to 12. If instead the data had been very spikey, like in the second histogram, with all the activity in three months and hardly any activity in the other months, sub-set coding, where only the most popular values are assigned codes and the rest of the values are coded inline, would be the best approach. Finally, if the data shows lumps of frequent values, then each lump with a code can be represented based on the accumulated frequency, and represent the months of each month as offsets within these lumps. Depending on the data distribution one might want to choose any of these three approaches, or the other. In fact, value prefix coding can express all three approaches and the dictionary contents optimization determines which mixture of approaches is optimal.

One way of thinking of the prefix values is as a hierarchy of intervals in the binary value space. The empty prefix represents the entire range of the column, while the prefix 0 represents the interval of values with 0 in the first bit position and the prefix 1 represents the interval of values with 1 in the first bit position. Note that this representation is independent of the semantics of the processed data. Our goal is to most efficiently represent values from the distribution by selecting a subset of the intervals that cover all potential values, fit in the L1 cache, and allow for efficient representation of the expected values.

A generalization of value prefix coding is value interval coding, where a code in the dictionary can represent any interval, not just an interval defined by the binary representation of the value. Value interval coding has much greater variability than value prefix coding, is more difficult to optimize and requires more data to be stored in the dictionary, thus forcing the use of relatively smaller dictionaries.

Our implementation of value prefix coding works first by finding the longest match in the dictionary for each value one wishes to compress. We output the code for this entry and follow it by remainder of the value suffix, inlined. In the present invention's implementation, the length of the suffix is determined by either coding fixed length values, in which case the length of the suffix is the fixed value length minus the length of the prefix, or for variable length character strings, it is known that the end of the value has been reached when a zero byte is processed in the input. Another alternative, more practical with variable length values that are not strings, is to explicitly store the length of the suffix after the prefix code. However, this approach might severely damage the compression performance of small values.

Representation

Value Prefix Coding performs best when the constructed prefix dictionary represents multiple values with the longest possible prefix as a single prefix code. That is, when the encoded value ranges are as small as possible. In the limit case, if the dictionary size can be sufficiently large to represent each value with a different entry, we have value ranges of length 1, equivalent to traditional dictionary based compression techniques. In general, some value ranges represented in the dictionary might be contained in others, whenever the optimization algorithm finds it appropriate to have both a large value range and a smaller one inside it coded independently. As a rule of thumb, the longer the common prefix, the more compactly individual values can be coded within that range, because the required suffix is shorter. It is the task of the optimization algorithm to find the set of value prefixes that would allow the best compression of the dataset, assuming known probability distribution function.

The data structure that makes the described binary prefix structure of values most evident is a trie or prefix tree. A leaf node represents a complete value from the input dataset. Internal nodes represent ranges of values with the same binary prefix. Each node is labeled with the prefix common to all values below it, which in the case of the leaves is the complete value. A value is associated to a trie node if the value starts with the prefix represented by the node. For the sake of facilitating computations, nodes also store the number of times values associated to their subtree appear in the input. This value count is used in the dictionary optimization stage, described later. Because of the way input is sampled to construct these tries, it is possible that the sum of sample counts in the offspring of an internal node v adds up to less than the count of v, indicating that some samples have been erased from the subtree after being sampled. If the common prefix of all values below a node v1 is p bits long and its child v2 represents values with a common prefix of p+c bits, then the edge that joins v1 and v2 is labeled with the last c bits of the prefix associated to v2. This way, accumulating the labels of the edges in a traversal from the root to the leaves of the tree would reconstruct the prefix of the values associated to those leaves. Note that we refer here to compressed tries, in which sequences of non-branching nodes are substituted by one edge with a longer label.

Figure 3:
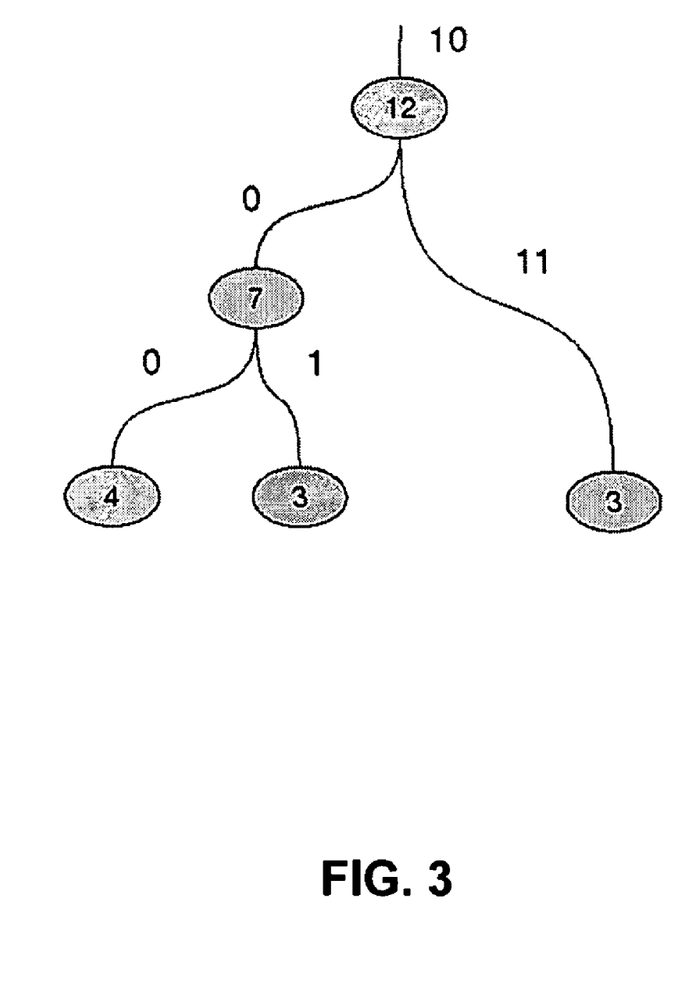
FIG. 3 depicts a simple example of one such trie data structure.

FIG. 3 depicts a simple example of one such trie data structure. The example trie data structure of FIG. 3 represents a sampling of the input and depicts the label associated with each edge in the tree, as well as the sample count for each node, which is used to compute the benefit function. The trie of FIG. 3 corresponds to a dataset with the values 1000, 1001 and 1011. The sample count (12) for the root node is lower than the sum of this count for its children (10), indicating that two values have been erased from the input sampling.

Algorithms that select nodes from this annotated trie in order to maximize a benefit function given a desired dictionary size are discussed later. These algorithms will choose as many trie nodes as entries are available by the dictionary budget. The set of chosen trie nodes represents the set of prefixes to be used for coding, as explained before.

Input Sampling

In order to choose the optimal set of prefixes used for compression, one needs to know the frequency of all values in the input. However, datasets are sometimes too large to keep complete statistics on each different value. In this case, it is necessary to sample the input and extrapolate the computed frequencies to the complete dataset. Two ways of sampling the input are considered. The first one is a single-pass reservoir-sampling approach. It has been proven in the paper to Vitter et al. entitled, "Random sampling with a reservoir," that reservoir-sampling algorithms, such as ones disclosed in the paper to Li et al. entitled, "Reservoir-sampling algorithms of time complexity o(n(1+log(N/n)))" can run in optimal expected time O(n(1+log N/n)). The second sampling method considered is a two-pass approach that first uniformly samples the input values, and then counts the number of times each sampled value appears in the input. While the second method is more accurate (because it provides the exact frequency of each chosen value instead of an approximation), it is more expensive both in terms of time and space (in order to do a uniform sample of all input values).

The output of both sampling methods is a trie with the sampled values in its leaves and certain frequency counts at the nodes of the trie. Specifically, in the leaves a sample count is kept for the associated complete values (number of times a value has been sampled), and in the internal nodes, a subtree count is kept that tracks the number of sampled values in the subtree. In the case of the second sampling method, the sample count of intermediate nodes is the same as the count of the leaves in their offspring. Because it involves deletion of samples, the first method might not meet this condition. Before the sampling result can be used for choosing the value prefixes, the counts in children nodes are increased to eliminate this difference. Since information about the distribution of erased sampled values is not available, one approach is to maintain the probabilities of the sample values in the subtree and uniformly scale up their frequencies to match the ones measured in higher nodes.

Optimizing Prefix Dictionaries

A discussion is presented regarding how the appropriate ranges are to be chosen among all the options in a sampling trie. A trie node is chosen if the value prefix it represents is selected to be used in the prefix dictionary. First, the objective function is maximized, which measures the gain in compression rate associated to choosing a trie node. Next, an algorithm is presented to find the absolute maximum of the objective function, and several heuristics are also presented that approximate it in a shorter time. Finally, a discussion is provided to see how these algorithms are adapted to handle the case in which the dictionary budget is shared by different data columns.

Benefit Function

Figure 4:
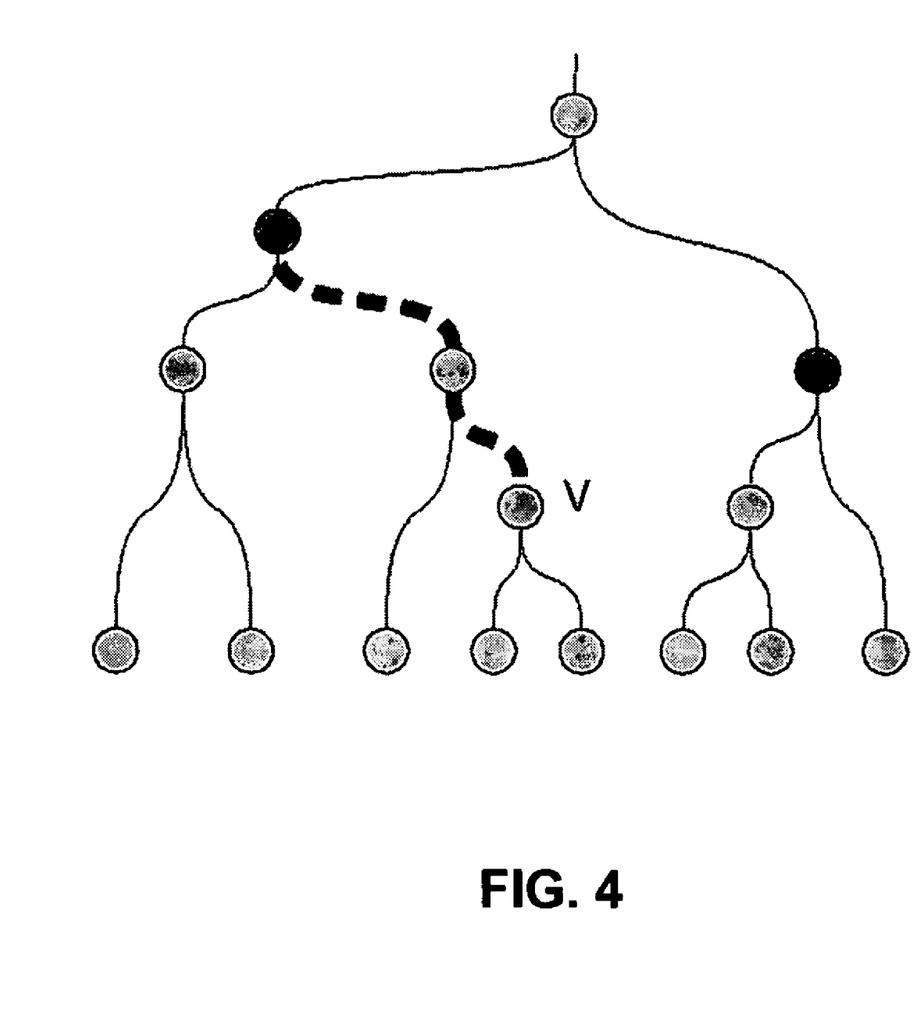
FIG. 4 illustrates a neck of node V that is connected (dashed) sequence of trie edges that start with V and ends either at the first chosen ancestor node (shaded dark) or the root.

All the information available about our input data is stored in the trie nodes mentioned above. Concretely, for each node v one needs to know its prefix p(v) and the count c(v) of samples represented by that prefix. The term neck of node v is defined as the connected sequence n(v) of edges from v to the first chosen ancestors of v, or the root of the trie if none of its ancestors is chosen (see FIG. 4 for a visual explanation). In FIG. 4, the neck of node V is the connected (dashed)sequence of trie edges that starts at V and ends either at the first chosen ancestor node(shaded dark), or the root, if no chosen nodes are found in that path.

In a trie with no chosen nodes, c(v) is the total sum of input samples with prefix p(v). Intuitively, choosing node v saves |n(v)| bits for each node below v that is to be coded using prefix p(v), and c(v) is the number of such nodes. Once a node v is chosen, these values are modified by subtracting c(v) from c(u), for each node u in n(v). Also, nodes w whose necks cross v need to have n(w) updated. Finally, the relative frequency of samples in node v is defined as f(v)=c(v)/N, where N is the total number of samples in the trie. After introducing the necessary terminology, the benefit function B(T) for trie T is defined as:

$$B(T) = \sum_{v \in T} b(v) \qquad (1)$$

where b(v) defines the benefit of an individual node as:

$$b(v) = \begin{cases} c(v) \cdot (|n(v)| + \log_2 f(v)), & \text{if } v \text{ chosen} \\ 0, & \text{if } v \text{ not chosen} \end{cases}$$

This expression measures the amount of space saved by omitting the prefixes of all samples represented by chosen nodes, minus the space taken by replacing these prefixes by the corresponding Huffman codes(with expected length $-\log_2 f(v)$).

Algorithms

Figure 5:
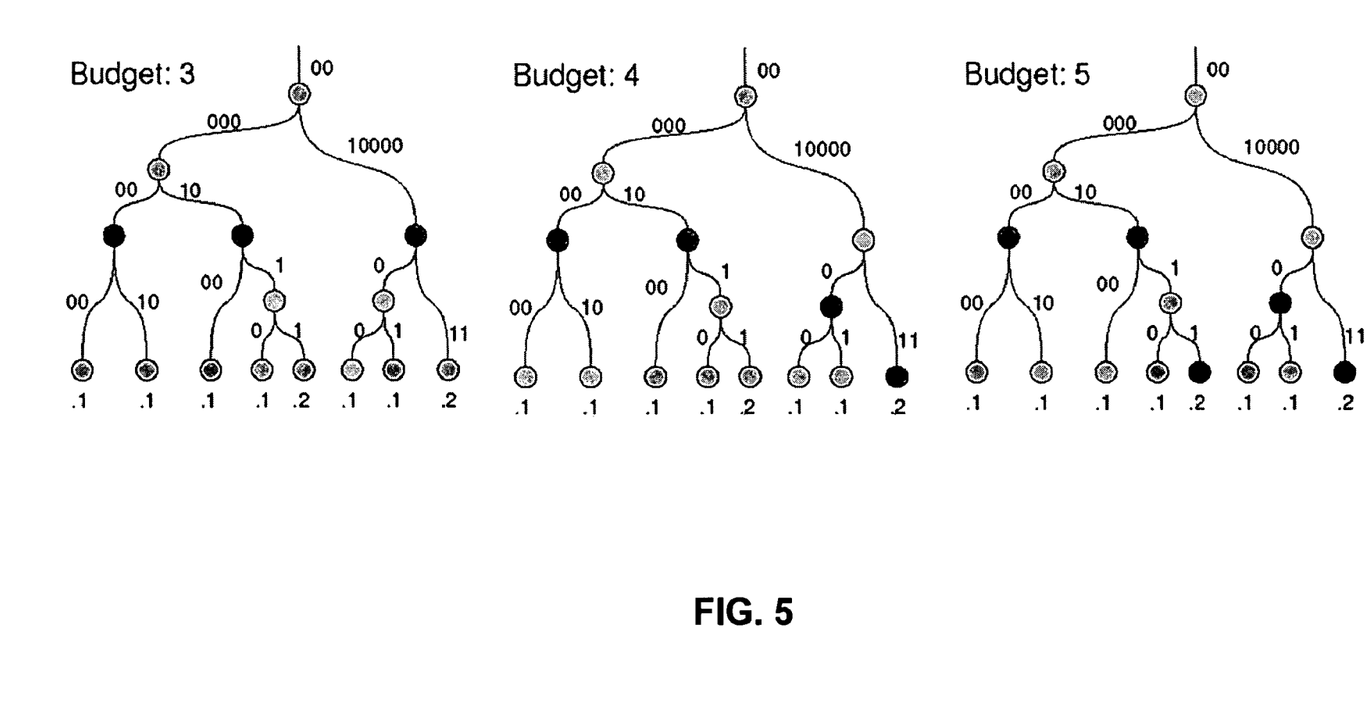
FIG. 5 illustrates an example of a prefix tree used to represent a sampling of the input, showing the label associated with each edge.

The brute force approach to solving the optimization is prohibitively expensive, with $$O\binom{N}{K}$$

possibilities for N distinct input values and a dictionary budget of K. Furthermore, the optimal choice of trie nodes does not follow an obvious pattern, as illustrated in FIG. 5. FIG. 5 illustrates an example of a prefix tree used to represent a sampling of the input, showing the label associated to each edge. The leaves represent complete input values. Chosen nodes (whose prefixes will be in the dictionary) are shaded dark. As the dictionary budget is increased, the optimal choice of trie nodes changes to include longer prefixes. However, this optimal choice does not follow an obvious pattern. In the example, increasing the budget from 3 to 4 nodes produces a split in the rightmost chosen node (the choice of a node is substituted with its two children). When the budget is further increased, no chosen nodes are discarded, but a new one is chosen in addition to the previous choice.

Fortunately, since the partial solution to the optimization for one branch of the trie is independent of the complementary partial solution for its sibling, redundant computations need not be performed more than once. This is the basis for the following dynamic programming algorithm that computes the optimal solution to the problem.

Optimal Solution

For a branch of the trie rooted at node v whose neck n(v) is L bits long and a dictionary budget K, a recursive algorithm is designed to compute its best choice of nodes. Left and right children of node v are labeled as l(v) and r(v), respectively. The optimal choice of prefixes in the subtree rooted at v is written opt(v, K, L). As a base case, if node v is a leaf and the budget K allows it, then the best option is to choose v. Otherwise, there are two possibilities. If v is chosen, then the budget K−1 is shared between l(v) and r(v), and the distribution of the K−1 budget is computed between the children that maximizes (1), as opt(l(v), i−1, L+Δ(L, l(v))) ∪ opt(r(v),K−i−1,L+Δ(L,r(v))), for i ∈ [1,K−1]. If node v is not chosen, then the complete budget K is shared between the children, computing the maximizing distribution among opt(l(v), i, l+Δ(L, l(v))) ↑ opt(r(v),K−i, L+Δ(L, r(v))) for i ∈ [0,K]. In the second case, the budget is simply shared among the two children of v, l(v) and r(v), while in the first case v itself is chosen, and only the remaining budget is saved for the offspring of node v. If node v is a leaf, then determining whether it should be chosen is a matter of seeing if the dictionary budget allows it. The number of possibilities to be evaluated is 2K−2 at each node, for each neck length. Already computed results are stored in a memorization table for reuse. Because the size of the tree is 2N−1, and the average length of the paths from root to leaves in a balanced tree is log N, the number of entries (and therefore the time complexity of the algorithm) is O(KN log N).

Greedy Heuristics

Although the optimal solution is available, it is often sufficient to have a reasonably good approximation at lower cost. Several heuristics are considered to achieve this goal, all requiring less computing time than the optimal algorithm. One of the best found computes the initial benefit of all the trie nodes, chooses the one with the best benefit and repeats the operation on the non-chosen nodes until the dictionary budget has been exhausted. This is called the iterative choice heuristic. A conservative node sorting approach can be used to implement this method in a way such that it runs in O(N log N+K log$_2$ N) time. Even though this heuristic requires much less time than the optimal solution, the compression ratio exhibited by the resulting dictionary is not much worse, or even identical for some datasets and budgets. It is reasonable to use this approach on a regular basis, resorting to the dynamic programming algorithm when optimality is required. It could be devised an improvement to this method based on backtracking, in order to reconsider previously chosen nodes after the new values of the benefit function are known.

A faster heuristic computes the initial benefit of all the nodes in the trie and picks the best K nodes without benefit recomputation. Since this method does not factor in the modifications to the benefit function introduced by choosing nodes, the achieved compression performance is inferior. On the other hand, the technique runs in just linear time on the size of the tree, or O(N log N) on the input cardinality N. Finally, for the sake of comparison, a heuristic that restricts the choice of nodes to the leaves of the trie is also considered. This corresponds to the widespread practice of selecting the K most frequent values to be assigned a dictionary entry, while the rest of the values are inlined. This method is called the dichotomic choice heuristic. The main advantage of this simple approach is its running efficiency, since it requires an efficiency that is slightly more than linear time, i.e., O(N+K log K).

Figure 6:
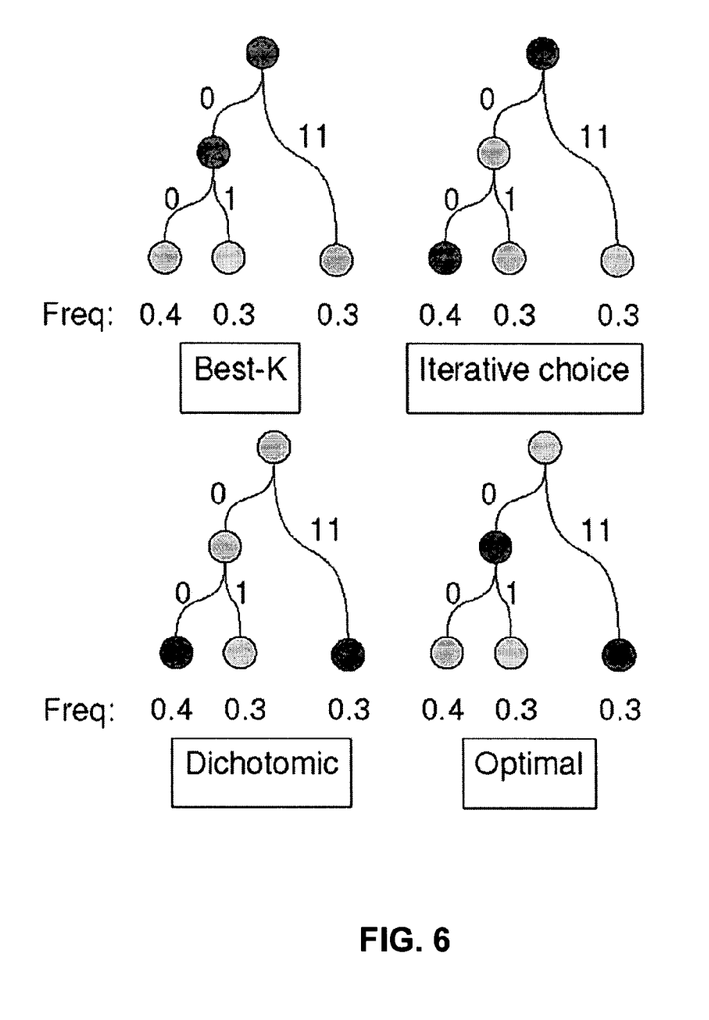
FIG. 6 illustrates an example of a sample trie in which the four outlined optimization techniques make different choices.

FIG. 6 illustrates an example of a sample trie in which the four outlined optimization techniques make different choices. The difference between the best-K and iterative choice heuristics is that the former does not re-evaluate the benefit function after having chosen the root node in the first step, which leads to a suboptimal choice. The optimal solution goes further in this analysis, not choosing the root node, since there is a set of lower nodes that provide an overall higher benefit. The dichotomic choice is the worst performer, since it is restricted to the leaves of the trie, and leaves one node not represented by any entry in the dictionary.

In this section, two heuristics to compute a reasonably good choice of value prefixes for dictionary compression are outlined, and are compared to the optimal solution and the traditional approach. Their running times range from just below the O(KN log N) of the optimal solution to just slightly more than linear time. Similarly, the achieved compression ratios fall in the interval between the optimal value and the more mundane dichotomic choice.

Multi-Column Data

So far the discussion is presented with respect to single-column tables, in which only one dictionary is necessary. However, often a separate dictionary is needed for each one of a set of columns. If decompression is done tuple by tuple, it is necessary to keep all dictionaries in memory at the same time, competing for cache memory. It is thus important to share the dictionary budget across columns to enable the fastest decompression possible. To serve that purpose, greedy heuristics is naturally well suited, as they essentially sort the trie nodes according to their benefit. The extension to multiple columns is natural: It suffices to jointly consider nodes from all the tries when performing the sorting operations.

On the other hand, adapting the dynamic programming algorithm to handle multiple columns requires a bit more work. Naive evaluation of all the ways to share budget K among M columns results in $$\binom{M+K-1}{K}$$

possibilities. Luckily, as with the single-column optimization, partial computations can be reused in order to construct higher level solutions. Our goal is to integrate the trie optimization algorithms in a meta-optimization stage that determines the best way to distribute the dictionary budget among the different columns. To do so, a balanced binary tree is constructed that has the tries from the different columns as its leaves. Then, starting from the root, one recursively computes the best configuration out of the K+1 possibilities at each node of the binary tree, sharing the budget between its two children. A memorization table saves previous results at each binary tree node to avoid redundant computations. See FIG. 7 for an example with 4 columns.

Figure 7:
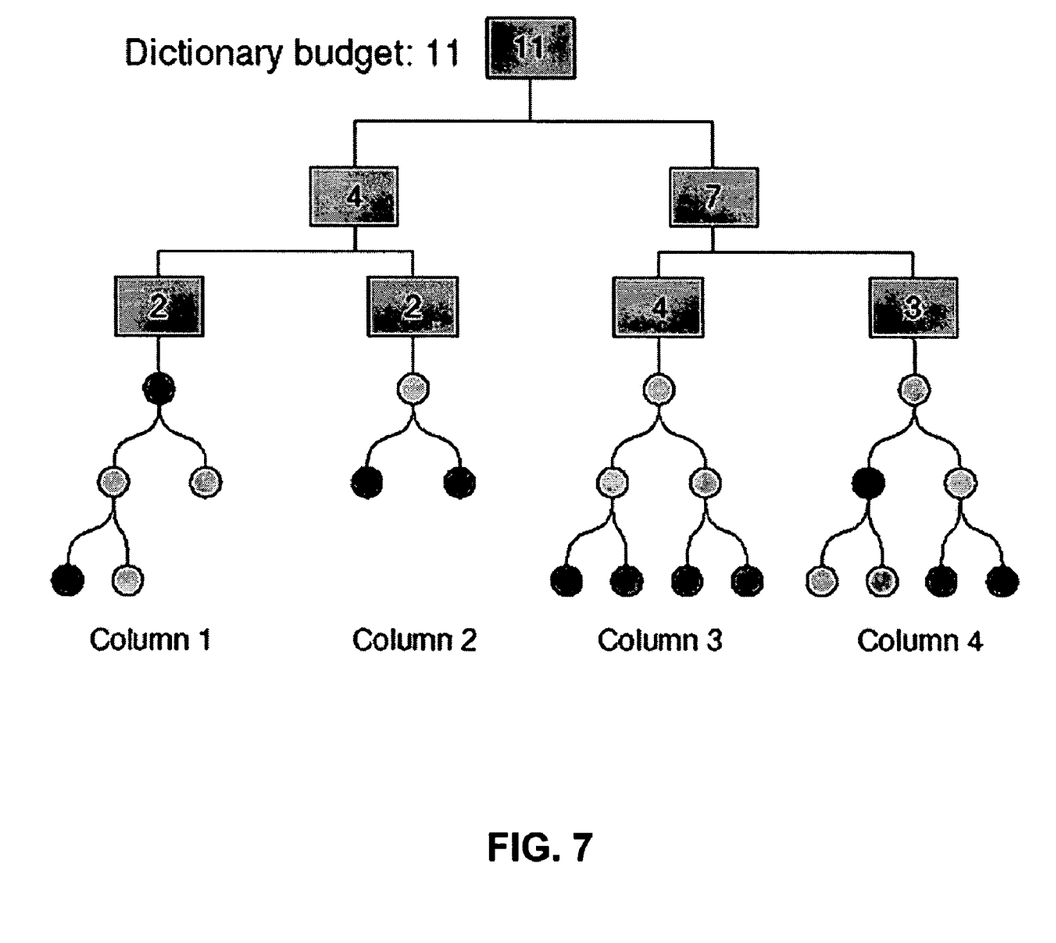
FIG. 7 illustrates a dictionary meta-optimization in a 4 column dataset.

FIG. 7 illustrates a dictionary meta-optimization in a 4 column dataset. The 11 entries dictionary budget is recursively shared among the (rectangular) nodes of a balanced binary tree whose leaves are associated to sample tries, corresponding to each one of the input columns. Then each trie is optimized independently with the allotted budget, and the hypothetical trie node choices shown as dark shaded nodes. When the recursion reaches the leaves of the binary tree, the regular trie optimization algorithm takes place. The result of the algorithm is a distribution of the dictionary budget among all the columns, and a set of chosen trie nodes for each column, given their allotted share of that budget. This way, an extra KM term is added to the time complexity of the algorithm, leaving it in O(K(M+N log N)).

Code Length Quantization

The original algorithm for decoding Huffman codes walks the Huffman tree one bit at a time until the leaf is reached. In a modern computer, this is painfully slow, memory inefficient, and involves a branch instruction at each level of the tree. The tree itself can be quite large, with two leaves for each value, and might not fit in cache.

Others have suggested alternative algorithms (see the paper to Hirschberg et al. entitled, "Efficient decoding of prefix codes," and the paper to Raman et al. entitled, "How to wring a table dry: entropy compression of relations and querying of compressed relations") where the Huffman codes are reordered to form a canonical Huffman dictionary. This reordering allows the length of a code to be determined by doing a search inside of a structure whose length is that of the number of distinct code lengths that may be used for this value. This reduces the cost of decoding considerably, but it still requires branches, whose result cannot be predicted.

Still other algorithms (for example, see paper to Choueka et al. entitled, "Efficient variants of Huffman codes in high level languages") play off speed for memory utilization and define a large look up table for storing information to decode the entries.

All of these techniques retain the Huffman code lengths as determined by the Huffman algorithm—no loss of compression is contemplated. The present invention provides an approach that allows one to trade off the size of the decode table with how close to the entropy the output size needs to be, and in all cases avoids branches. For many input distributions, this approach reaches very close to entropy with a very small table, so small that the table can fit in a corner of the L1 cache, a requirement for many code parsing algorithms.

Standard table based code parsing requires a table that is as long as the two to the power of the length of the longest Huffman code. This allows the application to decode the length and the value in just two instructions. For example, if register R1 holds next 64 bits of the input stream and the maximum length Huffman code is of length MAX CODE, and preconstructed tables consists of VALUE[index] and CODE LENGTH[index] then the code is parsed in just a few instructions.

R2=R1>>(64-MAX_CODE);
R3=CODE_LENGTH [R2]
R4=VALUE [R2]
R1<<=R3

The first instruction extracts a bit string that contains the code and the second uses it as an index to acquire the code length. The third instruction accesses the value and the final instruction advances the bit level data stream.

The trouble with this approach is that the VALUE table can be very large and sparse. In fact it can be exponential in the number of Huffman codes (see, for example, the paper to Hirschberg et al. entitled, "Efficient decoding of prefix codes"). For example, if the longest Huffman code is 10 bits long, but if there is also a 2 bit Huffman code, then 1024 entry VALUE table must contain 256 entries for decoding the two bit code, because the values of the next 8 bits are arbitrary.

Others have proposed limiting the maximum code length of a Huffman code. This can cause arbitrary loss of compression as entries with very low probability are assigned shorter codes that prevent other, higher frequency values, to get even shorter codes. There are optimization algorithms for finding the best Huffman dictionary with a restriction on code length.

It has been proposed (see, for example, the paper to Hirschberg et al. entitled, "Efficient decoding of prefix codes") that we store only the lengths of the Huffman codes in the sparse format but store the VALUE array in a dense format. This is based on the observation that once the length of the code is known, one can access the start of a dense array of elements that have that code length. This adds a small amount to our instruction count but, as the CODE_LENGTH array needs only use one byte per entry, certainly saves a lot of space. The instructions for access are as follows:

R2=R1>>(64-MAX_CODE);
R3=CODE_LENGTH [R2]
R5=VALUE_START [R3]
R4=R1>>(64-R3)
R4=R5 [R4]
R1<<=R3

Note that another table has been added—the VALUE_START table—that maps the code length into the address containing the start of the VALUE table for this code length. But the VALUE START table is very short: it contains at most MAX_CODE pointers. Two new instructions are added, one to access the VALUE_START table and one extra shift operation to compute the dense index into the VALUE array.

Note that this approach still utilizes as parse CODE_LENGTH table. In a previous paper to Holloway et al. entitled, "Compression and bandwidth trade-offs for database scans," it was noted that the CODE_LENGTH does not need to be of size $2^{MAX\_CODE}$, it only needs to be as long as two to the power of the second longest Huffman code. This is because of the property of prefix codes: the longest code must differ from the second longest code within the length of the second longest code.

The present invention is based on yet another observation: that an arbitrary bit count can be picked to produce a prefix code dictionary whose code length can be determined by looking only at that number of bits. This is called the length decode in k property. A prefix code can be length decoded in k, if the next k bits of the input stream determine the length of the code. The code sequence for this is exactly the same, the only difference is that instead of MAX_CODE above, the length decode limit is used.

In addition to being part of the scanner, the length decode limit is input to the Huffman dictionary generator. As long as the length decode limit is not too small, a good dictionary can be designed around it. By generating dictionaries with a length decode limit rather than a maximum code length, both smaller decode tables and more flexibility (in the lengths of codes that can be used) is obtained, which allows for more efficient compression.

For example, with a 4-bit length decode limit, the CODE_LENGTH table will have 16 entries which allows for 16 different code lengths, with no limit on the top end code length. Codes that are very short, less than the length decode limit, will take multiple entries in the CODE_LENGTH table, but since the table is of constant size, that is not a problem. For example, a 2-bit code will take up to 4 entries in the CODE_LENGTH array.

Figure 8:
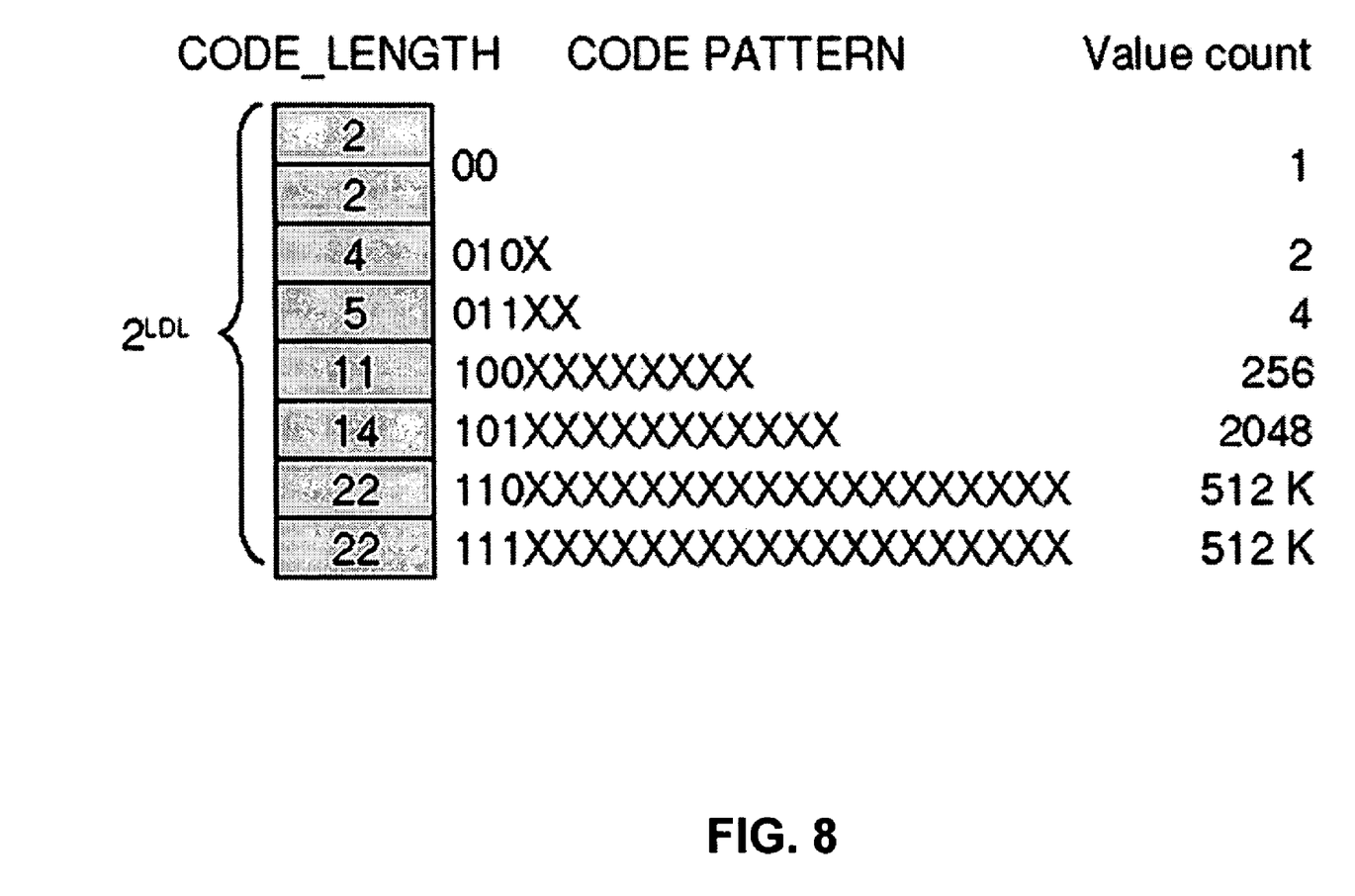
FIG. 8 illustrates a scenario where k bits are used to determine the code length.

Longer code lengths take up one position in the CODE_LENGTH table, but each such entry implies the existence of a code space that grows exponentially with the length of the code. For example, a 16 bit code given in a 16 code length table implies room for $2^16/2^4=2^12=4096$ entries, while a 10 bit code will have room for $2^10/2^4=2^6=64$ entries (see FIG. 8). When k bits are used to determine the 120000 code length, 2 to the power of the length minus k is the number of possible codes with a certain length. Because codes in powers of 2 are allocated in this way, this approach is called Quantized Huffman Coding.

In the next section we discuss the algorithm for building an optimal quantized dictionary and evaluate how close this algorithm comes to entropy for a variety of datasets and code length limits.

Optimizing Code Quantization

Computing optimal Huffman codes can be done in O(n log n) where n is the number of code words (see, for example, the paper to Huffman entitled, "A method for the construction of minimum redundancy codes"). Finding the optimal length limited Huffman code is slower, O(nL) where $L \geq \lg n$ is the maximum length code. In this section we present an algorithm for computing the optimal dictionary for a given length decode limit k. The algorithm presented here runs in time O(n log n+k $2^k$ log n). This algorithm and its closeness to optimal is incomparable with length limited Huffman, but when 2k≈L the two algorithms behave somewhat similarly, though the space required for tables at scan time is 2 L for length limited Huffman, and 2 k for quantized.

Additionally, the present invention provides for an article of manufacture comprising computer readable program code contained within implementing one or more modules to a method for compressing data with reduced dictionary sizes by coding value prefixes. Furthermore, the present invention includes a computer program code-based product, which is a storage medium having program code stored therein which can be used to instruct a computer to perform any of the methods associated with the present invention. The computer storage medium includes any of, but is not limited to, the following: CD-ROM, DVD, magnetic tape, optical disc, hard drive, floppy disk, ferroelectric memory, flash memory, ferromagnetic memory, optical storage, charge coupled devices, magnetic or optical cards, smart cards, EEPROM, EPROM, RAM, ROM, DRAM, SRAM, SDRAM, or any other appropriate static or dynamic memory or data storage devices.

Implemented in computer program code based products are software modules for: (a) receiving input data; (b) identifying a dictionary size budget; and (c) scanning a sample of input data values to identify occurrence frequencies of each value prefix in the sample; (d) scanning a sample of input data values to identify occurrence frequencies of each value prefix in the sample; (e) based on the identified dictionary size budget in (b) and the identified occurrence frequencies in (c), choosing a subset of value prefixes for which codewords are to be assigned; (f) building a dictionary and assigning prefix codes to the chosen subset of value prefixes in (d); and (g) rescanning the input data wherein, for each value v, finding its longest prefix u, chosen in step (e) and outputting a concatenation of codeword(u) and w, wherein w is the suffix of value v, said suffix comprising remaining uncoded bits of said given value.

CONCLUSION

A system and method has been shown in the above embodiments for the effective implementation of a method for compressing data with reduced dictionary sizes by coding value prefixes. While various preferred embodiments have been shown and described, it will be understood that there is no intent to limit the invention by such disclosure, but rather, it is intended to cover all modifications and alternate constructions falling within the spirit and scope of the invention, as defined in the appended claims. For example, the present invention should not be limited by specific method used to choose prefixes (e.g., by dynamic programming, greedy heuristics, etc.).

The invention claimed is:

1. A computer-based method to compress a dataset of values from one or more domains, said computer-based method implemented in computer readable program code stored in computer memory, said computer-based method comprising the steps of:
   a. receiving input data;
   b. identifying a dictionary size budget;
   c. scanning a sample of input data values to identify occurrence frequencies of each value prefix in said sample;
   d. based on said identified dictionary size budget in (b) and said identified occurrence frequencies in (c), choosing a subset of value prefixes for which codewords are to be assigned, wherein a choice of assigning prefix codes to common prefixes associated with a subset of said set of data values is optimized to provide maximum compression for a given constraint on the number of codewords;
   e. building a dictionary and assigning prefix codes to said chosen subset of value prefixes in (d);
   f. rescanning said input data wherein, for each given value v, finding its longest prefix u in said dictionary, chosen in step (e) and outputting a concatenation of codeword(u) and w, wherein w is the suffix of value v, said suffix comprising remaining uncoded bits of said given value, and
      wherein said optimization is performed via a dynamic programming algorithm, wherein, in said dynamic programming algorithm, best prefixes are chosen based on whether a given node v is a leaf node or whether the given node v is not a leaf node.

2. An article of manufacture comprising computer usable medium implementing a computer-based method to compress a dataset of values from one or more domains, said computer-based method implemented in computer readable program code stored in computer memory, said medium comprising:
   a. computer readable program code aiding in receiving input data;
   b. computer readable program code aiding in identifying a dictionary size budget;
   c. computer readable program code aiding in scanning a sample of input data values to identify occurrence frequencies of each value prefix in said sample;
   d. based on said identified dictionary size budget in (b) and said identified occurrence frequencies in (c), computer readable program code aiding in choosing a subset of value prefixes for which codewords are to be assigned, wherein a choice of assigning prefix codes to common prefixes associated with a subset of said set of data values is optimized to provide maximum compression for a given constraint on the number of codewords;
   e. computer readable program code aiding in building a dictionary and assigning prefix codes to said chosen subset of value prefixes in (d);
   f. computer readable program code aiding in rescanning said input data wherein, for each given value v, finding its longest prefix u in said dictionary, chosen in step (e) and outputting a concatenation of codeword(u) and w, wherein w is the suffix of value v, said suffix comprising remaining uncoded bits of said given value, and
      wherein said optimization is performed via a dynamic programming algorithm, wherein, in said dynamic programming algorithm, best prefixes are chosen based on whether a given node v is a leaf node or whether the given node v is not a leaf node.

3. The computer-based method of claim of claim 1, wherein best prefixes are chosen as per the following benefit function:
   for the case when a given node v is a leaf node, benefit(v, K,L)=max{max {benefit(left(v), i, L+1)+benefit(right (v), K−i, L+1)|0<=i<=K }, max{benefit(left(v), i−1, 1)+benefit(right(v), K−i, 1)|1<=i<=K }}; or
   for the case when a given node v is not a leaf node, benefit (v,K,L)=0 if K=1, or benefit(v,K,L)=benefit(v) if K>=1;
   wherein benefit of a node v is given by:

$$\text{benefit}(v) = \text{frequency}(v) \times \text{neck}(v) - \text{frequency}(v) \log(1/\text{frequency}(v));$$

wherein K represents a given dictionary budget, neck(v) represents the neck of a node v, L represents a neck length associated with a node, and left(v) and right(v) represent left and right nodes with respect to node v.

4. The computer-based method of claim 1, wherein the method additionally comprises the step of applying Huffman coding and assigning shorter codewords to more frequent prefix codes.

5. The computer-based method of claim 1, wherein a choice of assigning prefix codes to common prefixes associated with a subset of said set of data values is optimized to provide maximum compression for a given constraint on the number of codewords.

6. The computer-based method of claim 1 wherein a number of codewords are chosen such that said dictionary is chosen to fit within a cache associated with a computer implementing said computer-based method.

7. The computer-based method of claim 1 wherein said values in dataset are clustered via a clustering method, codewords being assigned to cluster identifiers instead of value prefixes.

8. The article of manufacture of claim 2, wherein best prefixes are chosen as per the following benefit function:
   for the case when a given node v is a leaf node, benefit(v, K,L)=max{max {benefit(left(v), i, L+1)+benefit(right (v), K−i, L+1)|0<=i<=K}, max{benefit(left(v), i−1, 1)+benefit(right(v), K−i, 1)|1<=i<=K}}; or for the case when a given node v is not a leaf node, benefit (v,K,L)=0 if K=1, or benefit(v,K,L)=benefit(v) if K>=1; wherein benefit of a node v is given by:

$$\text{benefit}(v) = \text{frequency}(v) \times \text{neck}(v) - \text{frequency}(v) \log(1/\text{frequency}(v));$$

wherein K represents a given dictionary budget, neck(v) represents the neck of a node v, L represents a neck length associated with a node, and left(v) and right(v) represent left and right nodes with respect to node v.

9. The article of manufacture of claim 2, wherein the method additionally comprises the step of applying Huffman coding and assigning shorter codewords to more frequent prefix codes.

10. The article of manufacture of claim 2, wherein a choice of assigning prefix codes to common prefixes associated with a subset of said set of data values is optimized to provide maximum compression for a given constraint on the number of codewords.

11. The article of manufacture of claim 2, wherein a number of codewords are chosen such that said dictionary is chosen to fit within a cache associated with a computer implementing said computer-based method.

12. The article of manufacture of claim 2, wherein said values in dataset are clustered via a clustering method, codewords being assigned to cluster identifiers instead of value prefixes.

13. A computer-based method to compress a set of data values from one or more domains, said computer-based method implemented in computer readable program code stored in computer memory, said computer-based method comprising the steps of:

a. building a dictionary and assigning prefix codes to common prefixes associated with a subset of said set of data values, and b. coding a given value in said set of data values as a combination of a codeword for said given value's longest prefix in said dictionary, followed by a suffix associated with said given value, said suffix comprising remaining uncoded bits of said given value, wherein said optimization is performed via a greedy algorithm, and the method further comprises the step of constructing a prefix tree, or trie, said trie representing statistical information about said input data, and, a leaf in said trie represents a complete input value, while an intermediate node represents the common prefix for the set of input values which are represented in a branch of the trie under that node, with statistical information being stored in the form of node labels, said greedy algorithm:

(1) computing a benefit for each prefix that measures the value of assigning a codeword to that prefix;

(2) choosing a node in said trie with the best benefit; and iteratively repeating steps (1)-(2) until a dictionary budget has been exhausted.

14. The computer-based method of claim 13 wherein a number of codewords are chosen such that said dictionary is chosen to fit within a cache associated with a computer implementing said computer-based method.

15. The computer-based method of claim 14 wherein said values in dataset are clustered via a clustering method, codewords being assigned to cluster identifiers instead of value prefixes.

* * * * *